United States Patent [19]
Azuma

[11] Patent Number: 5,357,226
[45] Date of Patent: Oct. 18, 1994

[54] NOISE FILTER

[75] Inventor: Takahiro Azuma, Nagaokakyo, Japan

[73] Assignee: Murata Manufacturing Co., Ltd., Japan

[21] Appl. No.: 64,838

[22] Filed: May 19, 1993

[30] Foreign Application Priority Data

May 20, 1992 [JP] Japan .................. 4-127588

[51] Int. Cl.⁵ .............................................. H03H 7/06
[52] U.S. Cl. .................................. 333/172; 333/185; 338/311; 361/308.1
[58] Field of Search ............... 333/172, 184, 185; 361/311–313, 308; 338/308, 311, 285

[56] References Cited

U.S. PATENT DOCUMENTS

| | | | |
|---|---|---|---|
| 1,767,715 | 6/1930 | Stoekle | 338/311 X |
| 2,828,454 | 3/1958 | Khouri | 333/185 X |
| 4,777,461 | 10/1988 | Sakamoto | 333/184 |
| 4,789,847 | 12/1988 | Sakamoto et al. | 333/184 X |

Primary Examiner—Seungsook Ham
Attorney, Agent, or Firm—Ostrolenk, Faber, Gerb & Soffen

[57] ABSTRACT

A noise filter 11 of the CR type in which electrodes 17a and 17b and electrodes 17d and 17e are formed on the outer surface of a collar portion 15 in a bobbin 12 composed of a dielectric body, recess portions 15c and 15d are respectively formed between the electrodes 17a and 17b and between the electrodes 17d and 17e, and resistance films 18a and 18b are respectively formed along the recess portions 15c and 15d. To form a noise filter of the LCR type, a coil 14 is formed on the bobbin 12 and connected to the electrodes 17b and 17d via electrodes 13a and 13b, respectively.

5 Claims, 6 Drawing Sheets

NOISE FILTER

BACKGROUND OF THE INVENTION

1. Field of the Invention

The present invention relates generally to a noise filter of a CR type or an LCR type, and more particularly, to an improvement of a noise filter in which at least one resistance film is formed on the outer surface of a dielectric body to constitute a resistance element or resistance elements.

2. Description of the Prior Art

FIG. 5 is a perspective view showing one example of a conventionally known noise filter. A noise filter 1 has a structure in which a winding 3 is wound around a core of a bobbin 2 composed of dielectric ceramics to constitute a coil portion 4. The bobbin 2 has a structure in which a pair of collar portions 5 and 6 is formed in both ends of the core, and electrodes 6a to 6c are formed spaced apart from each other by a predetermined distance on the outer major surface of the collar portion 5.

One end 3a and the other end 3b of the winding 3 constituting the above described coil portion 4 are electrically connected to the electrode 6a and the electrode 6c, respectively. The electrode 6b is formed as an earth electrode so as to take out capacitance between the electrode 6a and the electrode 6c in the bobbin 2 composed of dielectric ceramics. Consequently, an equivalent circuit of the noise filter 1 is as shown in FIG. 6. The electrodes 6a to 6c are used as terminals for connection to the exterior, thereby to construct a noise filter of a $\pi$ type.

When the above described noise filter 1 is used with it being inserted into a signal line, however, a signal waveform is distorted by the insertion of the noise filter 1, although a target noise can be reduced, to produce a new noise.

SUMMARY OF THE INVENTION

Therefore, a noise filter of an LCR type 7 constructed by adding resistance films to the outer major surface of one collar portion 5 in a pair of collar portions in a bobbin 2 composed of a dielectric body, as shown in FIG. 7, has been proposed, which has not been known yet.

In the noise filter 7, a plurality of electrodes 8a to 8e are formed spaced apart from each other by a predetermined distance on the outer major surface of the collar portion 5 in the bobbin 2 composed of dielectric ceramics. One end 3a and the other end 3b of a winding 3 are electrically connected to the electrode 8b and the electrode 8d, respectively. Capacitors are respectively formed between the electrode 8c and the electrodes 8b and 8d. In addition, a resistance film 9a is formed between the electrode 8a and the electrode 8b, to constitute a resistor. Similarly, a resistance film 9b is formed between the electrode 8d and the electrode 8e, so that a resistor is connected to the electrodes 8d and 8e.

Consequently, the noise filter 7 is a noise filter of an LCR type constructed among the electrodes 8a, 8c and 8e, as shown in an equivalent circuit diagram of FIG. 8. In the noise filter 7, the distortion of a signal waveform is suppressed by the function of the above described resistance films 9a and 9b.

When the noise filter 7 is used in a high frequency region, however, the effect produced by adding the resistance films 9a and 9b, that is, the effect of suppressing the distortion of the signal waveform cannot, in some cases, be sufficiently obtained. Specifically, in the high frequency region, it is impossible to suppress the distortion of the signal waveform even if the resistance films 9a and 9b are added.

An object of the present invention is to provide, in a noise filter having a structure in which a resistance film is formed between a pair of electrodes formed on the outer surface of a dielectric body to constitute a resistor, a noise filter capable of sufficiently reducing a noise and capable of reliably suppressing the distortion of a signal waveform whatever frequency region is used.

In accordance with a wide aspect of the present invention, there is provided a noise filter comprising a dielectric body, at least one pair of electrodes formed on the outer surface of the dielectric body, and a resistance film formed on the outer surface of the dielectric body so as to be connected to a pair of electrodes, a recess portion being formed on the outer surface of the dielectric body between the pair of electrodes, and the resistance film being formed along the recess portion.

It is considered that the reason why the effect produced by adding the resistance films 9a and 9b in the noise filter 7 shown in FIG. 7 is not obtained in the high frequency region as described above is that more current flows through the collar portion 5 composed of dielectric ceramics than the resistance films 9a and 9b between the electrodes 8a and 8b and between the electrodes 8d and 8e. Specifically, it is considered that in the high frequency region, much current flows through capacitors $C_1$ and $C_2$ formed in parallel with the resistors constituted by the above described resistance films 9a and 9b, as indicated by one-dot and dash lines A and B in the equivalent circuit diagram of FIG. 8, so that the effect produced by adding the resistance films 9a and 9b is lost.

In the present invention, therefore, by considering that the effect produced by adding the resistance film can be sufficiently exhibited if the flow of current toward the dielectric body is suppressed so that more current flows through the resistance film, the recess portion is formed on the outer surface of the dielectric body and the resistance film is formed along the recess portion, thereby to make it possible to obtain the effect produced by adding the resistance film, that is, suppress the distortion of the signal waveform.

More specifically, the present invention is characterized in that in a structure in which the resistance film is formed between at least one pair of electrodes formed on the outer surface of the dielectric body, the recess portion is formed on the outer surface of the dielectric body and the resistance film is formed along the recess portion, thereby to reduce current flowing toward the dielectric body to sufficiently exhibit the effect produced by adding the resistance film.

As described in the foregoing, according to the present invention, the recess portion is formed on the outer surface of the dielectric body between the pair of electrodes and the resistance film is formed along the recess portion. Accordingly, capacitance between the pair of electrodes is significantly reduced. Consequently, the effect produced by adding the resistance film cannot be sufficiently obtained in the high frequency region in the conventional noise filter, while the distortion of the signal waveform can be reliably suppressed by adding the resistance film because the capacitance between the above described pair of electrodes is reduced in the present invention.

According to the present invention, therefore, it is possible to provide a noise filter suitable for use in the high frequency region.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

A noise filter according to one embodiment of the present invention will be described with reference to the drawings.

Figure 2:
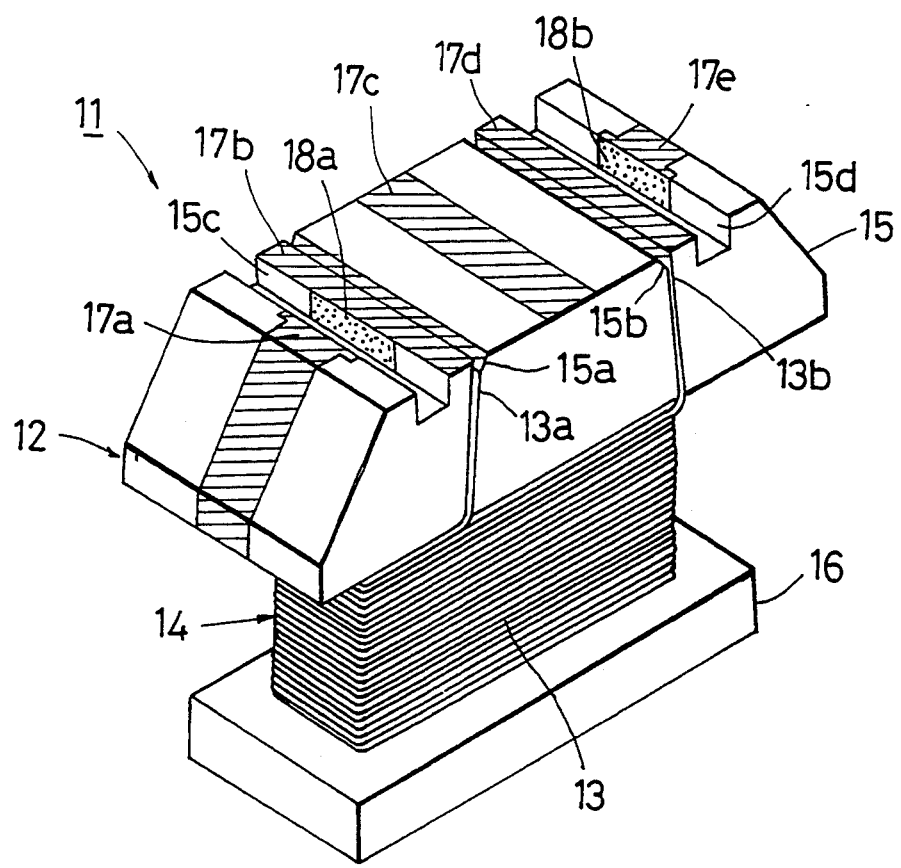
FIG. 2 is a perspective view showing the noise filter according to the present embodiment.

FIG. 2 shows a noise filter of an LCR type 11 according to one embodiment of the present invention. The noise filter 11 is constructed using a bobbin 12 composed of a dielectric material (which may have magnetism) such as ceramics or synthetic resin. A winding 13 is wound around a core of the bobbin 12, to constitute a coil portion 14. Collar portions 15 and 16 each having a larger area than that of the core are formed integrally with the core, and one end 13a and the other end 13b of the winding 13 extend to the outer major surface of the collar portion 15.

Figure 1:
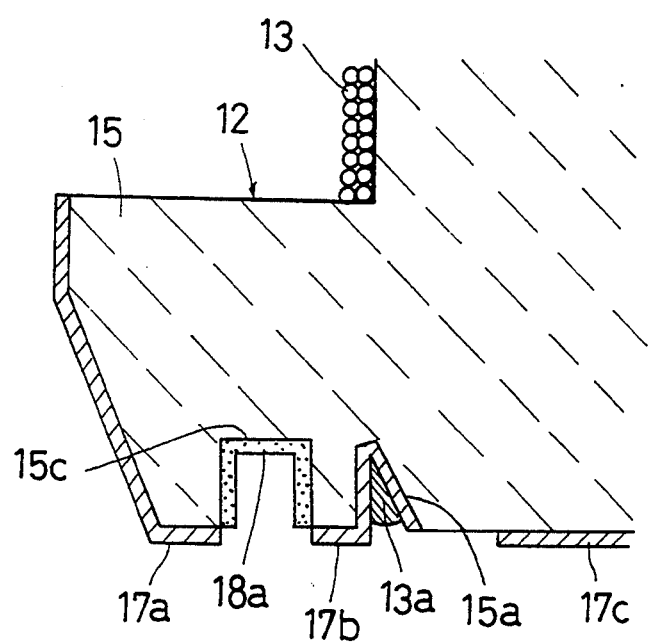
FIG. 1 is a schematic partially sectional view showing in an enlarged manner a portion where a resistance film is formed in a noise filter according to the present embodiment.

Electrodes 17a to 17e are formed spaced apart from each other by a predetermined distance on the outer major surface of the collar portion 15. As can be seen from main portions shown in an enlarged manner in FIG. 1, V-shaped grooves 15a and 15b are respectively formed on the outer major surface of the above described collar portion 15 in portions where the electrodes 17b and 17d are formed. The end 13a and the other end 13b of the above described winding 13 extend into the grooves 15a and 15b and are electrically connected to the electrodes 17b and 17d in the grooves 15a and 15b, respectively. Specifically, the grooves 15a and 15b are provided so as to electrically connect the end 13a and the other end 13b of the winding 13 to the electrodes 17b and 17d, respectively, without lifting the outer surface of the collar portion 15.

Furthermore, square groove-shaped recess portions 15c and 15d are respectively formed between the electrodes 17a and 17b and between the electrodes 17d and 17e on the upper surface of the collar portion 15. Resistance films 18a and 18b are respectively formed in the recess portions 15c and 15d along the recess portions 15c and 15d. The resistance films 18a and 18b are electrically connected to the electrodes 17a and 17b and the electrodes 17d and 17e, respectively.

Figure 3:
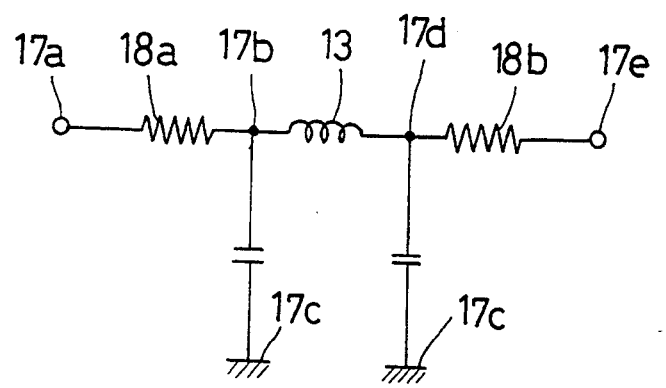
FIG. 3 is a diagram showing an equivalent circuit of the noise filter according to the present embodiment.
Figure 7:
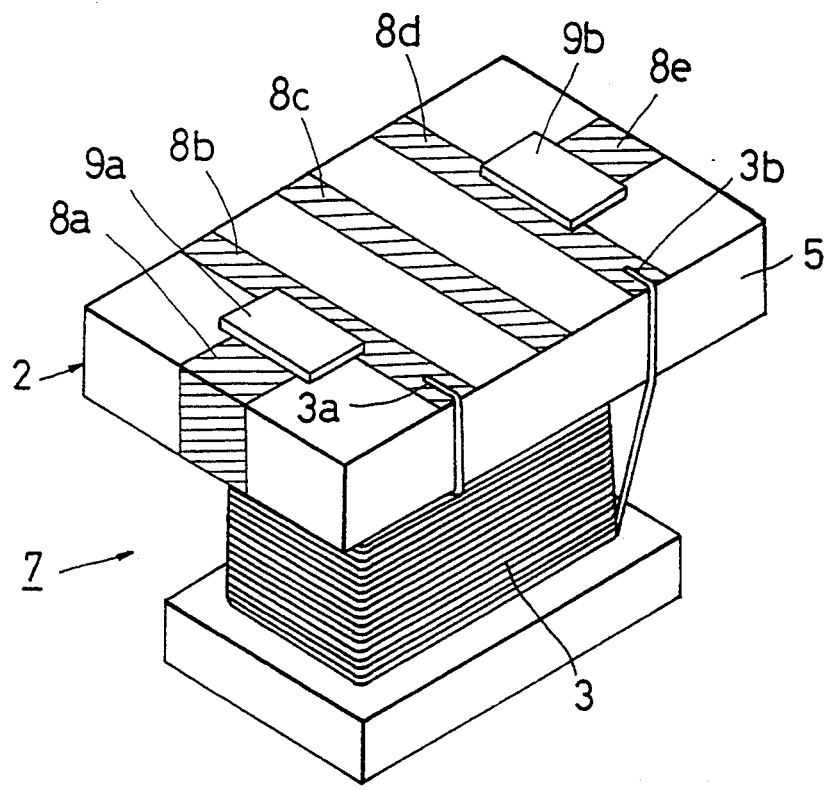
FIG. 7 is a perspective view showing a noise filter which has not been known yet, which is an incentive to make the present invention.
Figure 8:
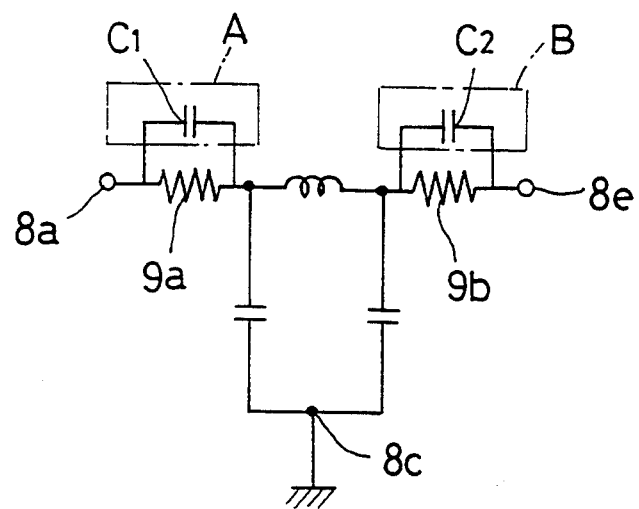
FIG. 8 is a diagram showing an equivalent circuit of the noise filter shown in FIG. 7.

An equivalent circuit of the above described noise filter 11 is as shown in FIG. 3. Specifically, the noise filter 11 is a filter of an LCR type constructed by connecting a pair of resistors to a filter of a $\pi$ type, similarly to the noise filter 7 shown in FIG. 7.

Moreover, in the noise filter 11 according to the present embodiment the resistance films 18a and 18b are respectively formed along the recess portions 15c and 15d, thereby to make it possible to reliably suppress the distortion of a signal waveform by the function of the resistance films 18a and 18b whatever frequency region is used. The reason for this will be described with reference to FIG. 4 by taking as an example a portion where the electrodes 17a and 17b are formed.

Figure 4A:
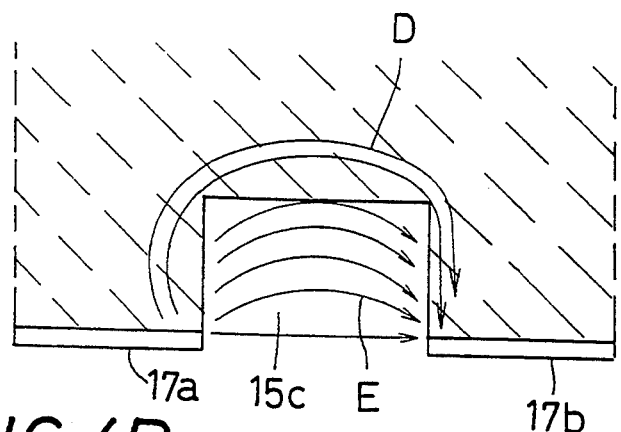
FIGS. 4A and 4B are enlarged partially sectional views for explaining the distribution of current flowing between a pair of electrodes in the noise filter according to the present embodiment and a noise filter shown in FIG. 7, respectively.
Figure 4B:
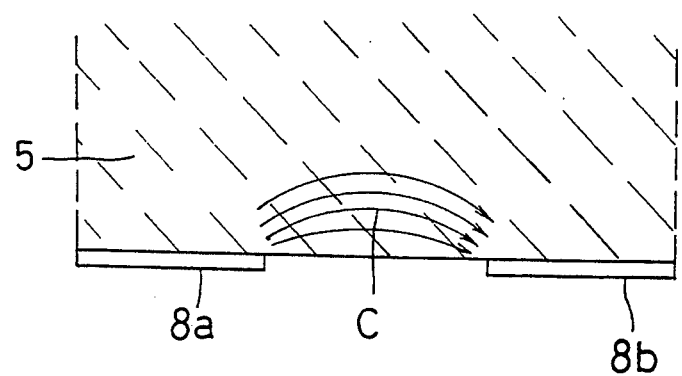
Figure 5:
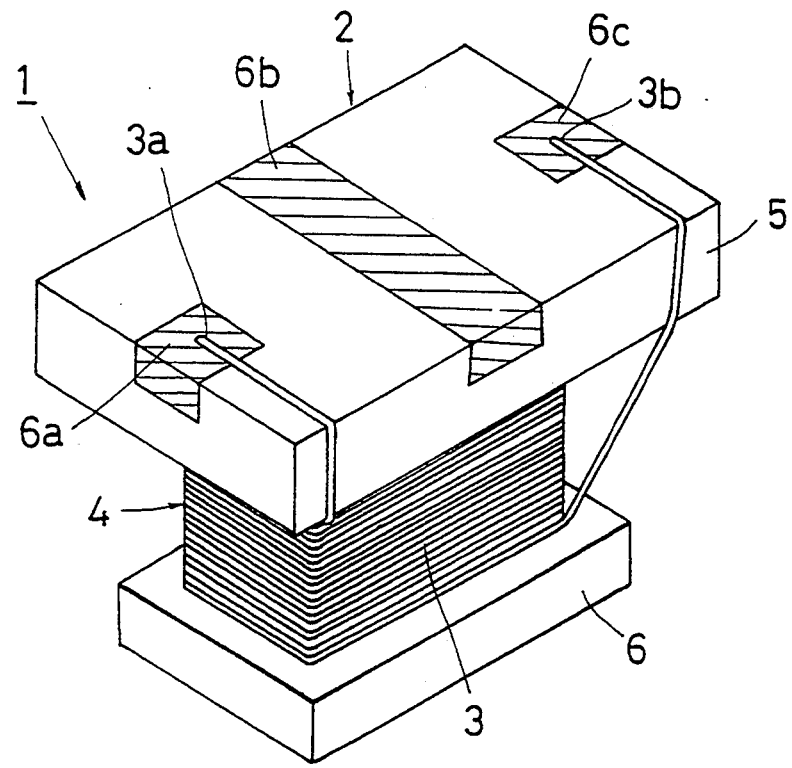
FIG. 5 is a perspective view showing one example of a conventional noise filter.
Figure 6:
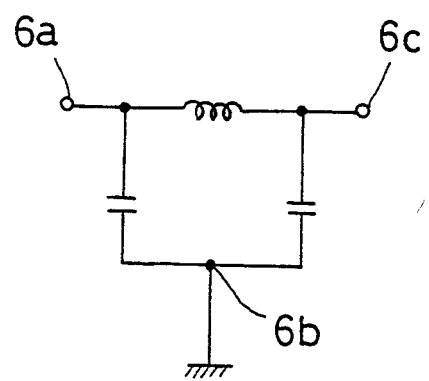
FIG. 6 is a diagram showing an equivalent circuit of the conventional noise filter.

FIG. 4A is a cross sectional view showing in an enlarged manner the portion where the electrodes 17a and 17b are formed excluding the resistance film 18a, and FIG. 4B is a cross sectional view showing in an enlarged manner a portion where the electrodes 8a and 8b are formed excluding the resistance film 9a in the noise filter 7.

As apparent from FIG. 4B, when a voltage is applied between the electrodes 8a and 8b, a line of electric force passes through the collar portion 5 in the bobbin composed of a dielectric body, as indicated by an arrow C. Even if a resistance film is connected to the electrodes 8a and 8b, therefore, more current flows through the collar portion 5 than the resistance film in a high frequency region. As a result, it is impossible to sufficiently obtain the effect produced by adding the resistance film 9a (see FIG. 7). On the other hand, in the present embodiment, it is considered that when a voltape is applied between the electrodes 17a and 17b, current flows along a line of electric force D passing through the collar portion 15 composed of a dielectric body and a line of electric force E connecting the electrodes 17a and 17b to each other at a shorter distance, as shown in FIG. 4A. Since the line of electric force E passes through air having a very small dielectric constant, however, little current flows along the line of electric force E.

Furthermore, the current flowing along the line of electric force D is much less than the current flowing along the line of electric force C because the creeping distance between edges of the electrodes 17a and 17b is made longer by twice the depth of the recess portion 15c, as compared with that in the case shown in FIG. 4B. For example, if a case is assumed where the depth of the recess portion 15c shown in FIG. 4A is equal to the distance between the electrodes 17a and 17b, capacitance between the electrodes 17a and 17b can be reduced to almost one third of capacitance between the electrodes 8a and 8b in a case where the recess portion 15c is not formed.

Consequently, the capacitance between the electrodes 17a and 17b can be significantly reduced by forming the recess portion 15c. As a result, when a resistance film is formed along the recess portion 15c, more current flows through the resistance film, thereby to make it possible to reliably suppress the distortion of the signal waveform by adding the resistance film.

Although in the above described embodiment, the present invention is applied to the noise filter of an LCR type, the present invention is also applicable to a noise filter of a CR type. Specifically, the present invention is applicable to any noise filter having a structure in which at least one pair of electrodes is formed on the outer surface of a dielectric body such as synthetic resin or ceramics and a resistance film is formed between the pair of electrodes to constitute a resistor, as in the above described embodiment. In the noise filter, capacitance between the pair of electrodes can be significantly reduced, thereby to make it possible to prevent the function of the resistance film from being reduced due to the capacitance.

Figure 9:
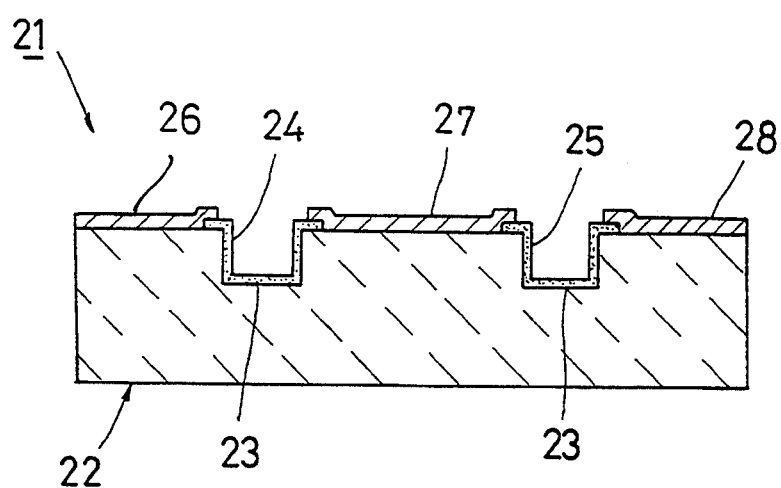
FIG. 9 is a cross sectional view showing a noise filter according to another embodiment.

An embodiment of the above described noise filter of a CR type is shown in a cross sectional view of FIG. 9. The noise filter of a CR type 21 has a plate-shaped dielectric body 22. The plate-shaped dielectric body 22 has recess portions 23 formed on its upper surface, and resistance films 24 and 25 are respectively formed along the inner surfaces of the recess portions 23. Electrodes 26 and 27 are formed on the upper surface of the dielectric body 22 so as to be electrically connected to both ends of the resistance film 24, respectively. Similarly, the above described electrode 27 and an electrode 28 are formed on the upper surface of the dielectric body 22 so as to be electrically connected to both ends of the resistance film 25, respectively. Respective capacitors are formed between the electrodes 26 and 27 and between the electrodes 27 and 28 similar to the capacitors formed between the electrodes 17a and 17b and the electrodes 17d and 17e. Consequently, the electrodes 26 and 28 are electrically connected to the exterior, thereby to make it possible to operate the noise filter of a CR type 21. Since the resistance films 24 and 25 are respectively formed in the recess portions 23, however, it is possible to significantly reduce capacitance between the electrodes 26 and 27 and capacitance between the electrodes 27 and 28.

Although the present invention has been described and illustrated in detail, it is clearly understood that the same is by way of illustration and example only and is not to be taken by way of limitation, the spirit and scope of the present invention being limited only by the terms of the appended claims.

what is claimed is:

1. A noise filter comprising:
   two pairs of electrodes formed on the outer surface of a first part of said dielectric body,
   respective recess portions formed on the outer surface of said dielectric body between each of the two pairs of electrodes, thereby forming respective capacitors between each pair of electrodes, and
   respective resistance films formed along each recess portion.

2. The noise filter according to claim 1, wherein an inductance element is connected to respective electrodes in said two pairs of electrodes, thereby to construct a noise filter of an LCR type.

3. The noise filter according to claim 2, wherein said inductance element is a coil portion constituted by a winding wound around a second part of said dielectric body spaced from said first part.

4. The noise filter according to claim 3, wherein grooves are respectively formed in portions of the outer surface of the dielectric body where the respective electrodes, which are electrically connected to said coil portion, in said two pairs of electrodes are formed and
   said respective electrodes are respectively formed along the inner surface of the grooves,
   said winding having first and second ends which are electrically connected respectively to the respective electrodes in said grooves.

5. A noise filter of the CR type comprising:
   a dielectric body;
   at least one pair of electrodes formed on the outer surface of said dielectric body; and
   a resistance film formed on the outer surface of said dielectric body so as to be connected to the pair of electrodes to thereby form a resistor therebetween;
   a recess portion being formed on the outer surface of said dielectric body between said pair of electrodes to thereby form a capacitor therebetween; and
   said resistance film being formed along the inner surface of said recess portion.

* * * * *